United States Patent [19]
Cole et al.

[11] Patent Number: 5,169,678
[45] Date of Patent: Dec. 8, 1992

[54] LASER ABLATABLE POLYMER DIELECTRICS AND METHODS

[75] Inventors: Herbert S. Cole, Scotia; Robert J. Wojnarowski, Ballston Lake, both of N.Y.

[73] Assignee: General Electric Company, Schenectady, N.Y.

[21] Appl. No.: 456,421

[22] Filed: Dec. 26, 1989

[51] Int. Cl.$^5$ ............ B05D 3/06; B05D 5/12; B23K 26/00

[52] U.S. Cl. ................ 427/555; 427/96; 427/264; 427/273; 427/276; 427/384; 156/628; 156/643; 219/121.69; 219/121.71; 219/121.72

[58] Field of Search .......... 427/53.1, 384, 385.5, 427/271, 96, 264, 273, 276; 156/628, 643, 659.1; 219/121.69, 121.71, 121.72

[56] References Cited

U.S. PATENT DOCUMENTS

| | | | |
|---|---|---|---|
| 4,504,548 | 3/1985 | Esho et al. | 430/11 |
| 4,547,444 | 10/1985 | Bell et al. | 428/426 |
| 4,568,632 | 2/1986 | Blum et al. | 427/53.1 |
| 4,824,699 | 4/1989 | Woo et al. | 427/54.1 |
| 4,915,981 | 4/1990 | Traskos et al. | 427/53.1 |
| 5,061,341 | 10/1991 | Kildal et al. | 427/53.1 |

Primary Examiner—Marianne Padgett
Attorney, Agent, or Firm—Marvin Snyder

[57] ABSTRACT

The ultraviolet absorption characteristics of a polymer material are modified by the addition of an ultraviolet absorbing dye to render it laser ablatable at a frequency at which the unmodified material is substantially non-laser ablatable.

20 Claims, 6 Drawing Sheets

LASER ABLATABLE POLYMER DIELECTRICS AND METHODS

RELATED APPLICATION

This Application is related to application Ser. No. 07/457,127, filed concurrently herewith, entitled "Enhanced Fluorescence Polymers and Interconnect Structures Using Them" by H. S. Cole, et al. That Application is incorporated herein by reference.

BACKGROUND OF THE INVENTION

1. Field of the Invention

The present invention relates to the field of polymers, and more particularly, to polymer dielectrics for use in electronic applications.

2. Background Information

There are a wide variety of polymer materials which may be used as dielectric layers and for other purposes in electronic and other applications. Each polymer composition has a set of physical properties such as density, water absorption tendency, dielectric constant, melting point or softening point, color, susceptibility to laser ablation, and so forth. A high density interconnect (HDI) system is disclosed in U.S. Pat. No. 4,783,695 to C. W. Eichelberger et al. Methods of fabricating such high density interconnect structures are disclosed in U.S. Pat. Nos. 4,714,516 and 4,835,704 to C. W. Eichelberger et al. This high density interconnect structure comprises integrated circuit chips having contact pads thereon mounted on a substrate with a dielectric layer adhesive bonded thereover. Via holes are formed through the dielectric layers and a patterned metallization layer is disposed on top of the dielectric layer and extends into the via holes to make electrical contact to the contact pads of the circuit chips.

This structure places special requirements on the dielectric materials. In particular, in order for the final structure to be usable over a wide temperature range, the dielectric layers must have high melting points and high thermal stability. They must also be laser ablatable by ultraviolet light in order to form the via holes through which different layers of metallization are connected. In the HDI system, laser processing (ablation, photoresist exposure, etc.) is normally done with one, or at most, two passes of the laser beam with a power ranging from 0.5 to 2.0 watts with a preferred maximum power level being about 1.5 watts. Thus, when a dielectric layer is characterized as being laser ablatable, it means that such a layer can be totally removed by one or two passes of a laser beam of this power level and when it is characterized as not being laser ablatable, it means that a layer is not completely removed by one or two passes of such a laser beam.

To minimize the complexity and cost of equipment for fabricating such high density interconnect structures, it is considered desired to be able to do all laser processing at a single frequency in order that only a single laser is required. Accordingly, preferred materials are those which may be processed at a laser frequency of 351 nm. This frequency was selected in accordance with the characteristics of desirable dielectric layers such as Kapton ® polyimide available from E. I. DuPont de Nemours and the fact that there are commercial photoresists which can be processed at this frequency. ULTEM ® polyetherimide resin available from General Electric Company has been used as an adhesive layer in this high density interconnect structure for bonding Kapton ® to the underlying structures. The ULTEM ® resin is laser ablatable at 351 nm. The ULTEM ® material has a melting point in the neighborhood of 220° C. or higher, depending on its specific formulation. This ULTEM ® high temperature adhesive layer is suitable for use in permanent structures.

A need has developed for temporary structures in which it is desirable to have an adhesive layer whose melting point is in the vicinity of 150° C. rather than 220° C. Unfortunately, Applicants have been unable to find a suitable dielectric material having a melting point in the vicinity of 150° C. which has all the other properties required for use in the HDI system. In particular, dielectric materials which are otherwise suitable are not sufficiently laser ablatable at 351 nm to be practical in the HDI system.

U.S. Pat. No. 4,617,085 to Cole, Jr. et al. entitled "Process for Removing Organic Material in a Patterned Manner from an Organic Film" discloses a combination of two different laser ablatable materials such as a blend of polymethylmethacrylate (PMMA) and poly(α-methyl styrene) (PS). While each of these materials is laser ablatable, a blend comprised of appropriate ratios of these materials is substantially more laser ablatable than either one alone.

OBJECTS OF THE INVENTION

A primary object of the present invention is to provide a low melting temperature polymer layer which is suitable for use as an adhesive in an HDI system and which is laser ablatable at 351 nm.

Another object of the present invention is to modify the absorbance characteristics of a polymer material to render it laser ablatable at a laser frequency to which the polymer material itself is substantially transparent and thus not laser ablatable at that frequency.

Another object of the present invention is to provide a means of modifying a polymer layer to render it laser ablatable at a frequency at which it is not naturally laser ablatable.

SUMMARY OF THE INVENTION

The above and other objects of the invention which will become apparent from the specification as a whole, including the drawings, are accomplished by modifying a polymer layer in which the basic polymer is transparent at a desired laser ablation frequency by incorporating in the basic polymer a dye which is absorbent at the desired laser ablation frequency. The dye is included in the polymer in a sufficient concentration and distributed in a manner to render the modified polymer layer laser ablatable at that frequency. One method of forming such a layer comprises dissolving the polymer material and the dye in a solvent in which they are mutually soluble, coating a substrate with that solvent solution and removing the solvent to leave a layer of the modified polymer on the substrate. Alternatively, the dye may be added to a melt of the basic polymer or diffused or dissolved into an already existing layer of the basic polymer. This modified polymer layer is preferably a solution of the basic polymer and the dye rather than a chemical combination of them in order to minimize the differences between the other physical properties of the modified and basic polymers. The dye may also be disposed in the form of a suspension of submicron particles. A high density interconnect structure preferably includes a dielectric layer comprised of the dye/polymer solution.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
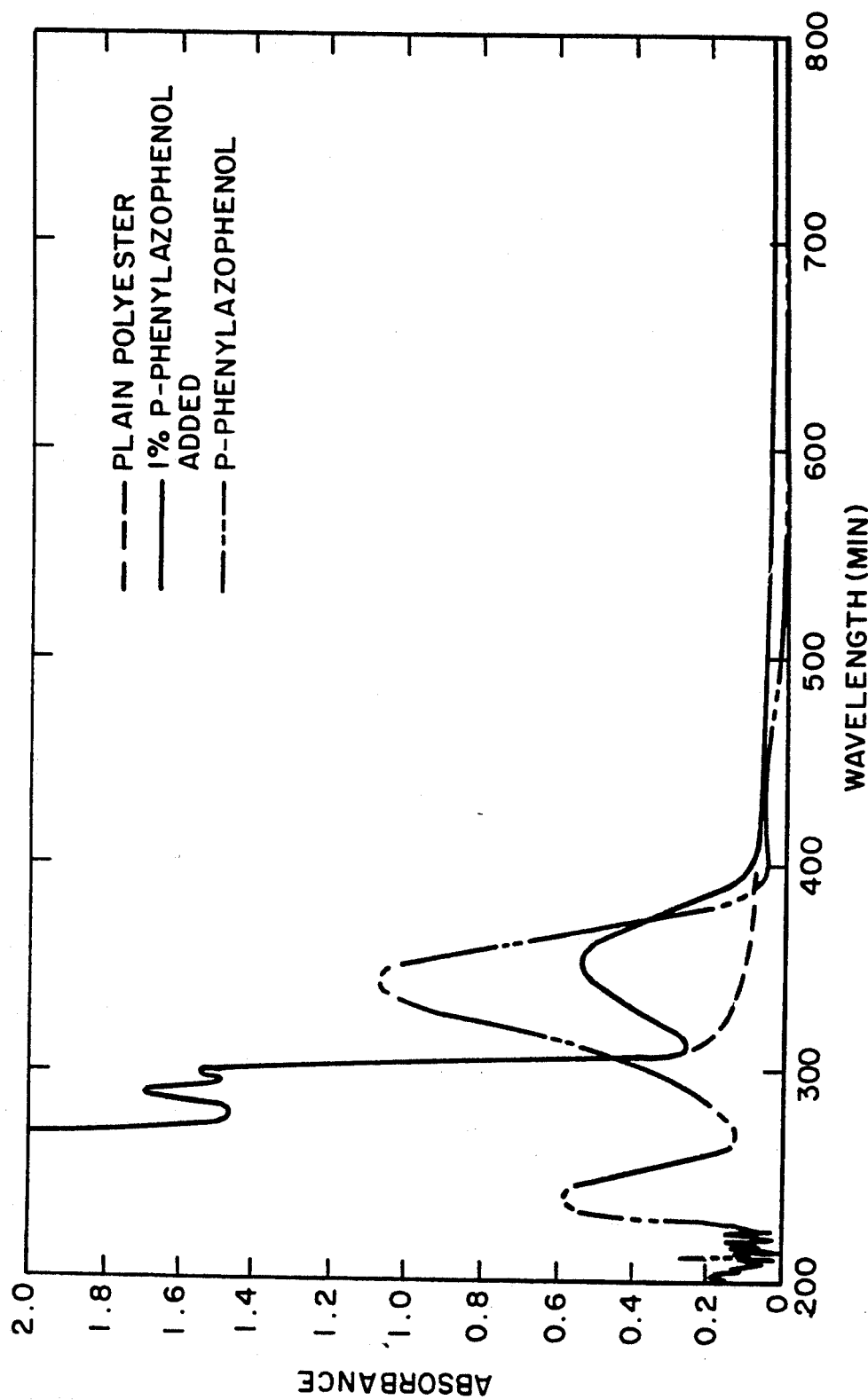
FIG. 1 illustrates the absorption spectrum of a particular polyester with and without an absorbent dye dissolved therein.

It is well known in the dye art that the absorption spectrum of a dye may be modified by changing its structure to include different chemical groups having different absorption spectra. While the objective of the present invention of providing a low temperature thermoplastic adhesive polymer which is laser ablatable at 351 nm could potentially be achieved by modifying the structure of an existing polymer in order to render it absorptive in that frequency band, such a procedure is not preferred. First, typical polymer molecules have molecular weights in the vicinity of 50,000 and have molecular lengths on the order of 30,000Å. In contrast, a typical dye has a molecular weight of only several hundred and a length on the order of 30 to 50 angstroms or so. Consequently, in order to directly modify such a large polymer molecule to render it laser ablatable, the basic building block of which the polymer chain is comprised would have to be modified. That would result in modification of many of the physical properties of the polymer thereby, most likely, changing the polymer's desired properties.

Thus, in accordance with the present invention, a polymer material having an optical transmission characteristic which includes a substantially transparent band in the ultraviolet portion of the spectrum, i.e. a pass band in the ultraviolet, is rendered laser ablatable at a frequency within the pass band by incorporating in the polymer a dye which is absorbent at the laser ablation frequency. This invention is primarily directed to polymer materials which are thermoplastic in the sense that upon multiple cycles of heating and cooling, the melting point of the polymer material remains substantially unchanged. That is, no substantial cross-linking of the material takes place during the heating, melting and resolidifying process. Such polymers are suitable as adhesive layers for bonding higher temperature polymers to substrates and may also themselves be used as layers to be bonded to substrates through the use of lower temperature adhesive layers. However, it may also be used with thermoset materials in which cross-linking takes place such that the material either no longer melts or melts at a much higher temperature and with higher melting point thermoplastic materials.

In order to form a polymer/dye layer in accordance with this invention, it is preferred that both the dye and the polymer be soluble in the same solvent. A solvent mixture of the polymer and the dye may then be formed in which the dye is uniformly distributed in the polymer. A coating formed using this solvent solution will have a uniform dye distribution in the polymer after the solvent has been driven off by heating or other processing. It is also desirable that the dye be soluble in the polymer in order that the dye will not separate from the polymer or precipitate in it. With the dye dissolved in the polymer, the dye is evenly distributed in locally-low concentrations with the result that the dye molecules are spaced apart and upon absorbing energy from ultraviolet light become highly energized and transfer that energy readily to the molecules of the host polymer. This energy then breaks bonds within the polymer to create volatile enough products that the polymer ablates. Where the dye is not soluble in the polymer, precipitation of the dye can result in the formation of clumps or particles of the dye which are large enough that even upon absorbing incident ultraviolet light, they do not efficiently transfer that energy to the host polymer with the result that little or no bond breaking and ablation take place.

It is preferred that the dye be highly absorbing at the desired ablation frequency, that is, that it have a high extinction coefficient at that wavelength in order that small quantities of the dye in the polymer will be effective for rendering the polymer laser ablatable, thereby minimizing the effect of the dye on the polymer's other physical characteristics. An extinction coefficient of $10^5$ would be excellent, while typical good dyes have an extinction coefficient in the range of $2\times10^4$ to $4\times10^4$.

Such polymers (molecular weight $\sim$50,000) and dyes (molecular weight $\sim$several hundred) may preferably be dissolved in a solvent having relatively low boiling point (i.e. in the vicinity of 100° C. or less) such that the solvent can be easily removed by baking after the layer has been applied. For use in dielectric layers, it is preferred that the polymer have as high a resistivity as possible and thus, a non-ionic dye is desired in order to minimize changes in the polymer's dielectric characteristics. For the same reason, it is desirable to have the dye in very pure form. The dye should also be thermally stable at all temperatures to which it will be exposed during processing in order that the dye's desirable characteristics will not be destroyed during processing. For long term reliability, it is also desirable that the dye be thermally, photo and chemically stable in the environments in which it will be disposed, particularly where its decomposition products could be detrimental either to the polymer in which it is disposed or the adjacent materials.

A number of methods may be used to form a polymer layer of this type. First, the polymer and the dye may be dissolved in a solvent in which they are mutually soluble. That solvent solution may be coated on a substrate and the solvent removed by evaporation and baking in order to provide a polymer layer having a substantially uniform distribution of the dye in the polymer layer. Alternatively, the polymer itself may be melted and the dye added to the polymer melt after which the hot polymer may be formed into a layer or film in which the dye is substantially uniformly distributed. Further, an existing layer of the polymer material may have the dye diffused or dissolved into it by dissolving the dye in a solvent for both the dye and the polymer layer and coating the polymer layer with this solvent dye solution. After the dye has partially or completely dissolved into the polymer layer, the solvent is removed to leave a polymer layer having the dye distributed therein.

EXAMPLE 1

A polyimide layer having a polyester adhesive layer disposed thereon was obtained from Sheldahl Corporation under their catalog number T-320. The polyester adhesive layer was dissolved from this film using chloroform. The resulting solvent solution of the polyester was dried by driving off the chloroform. Separate control and dye-modified solutions of the polyester were then formed, each containing 1 gram of the polyester and 5 grams of chloroform. The control solution contained only these two materials while the dye solution included, in addition, 0.01 gram of p-phenylazophenol. Each solution was thoroughly stirred and then spin coated on a quartz substrate and baked in an oven at 100° C. for one half hour to remove the solvent. The absorbance spectra of the two layers were then measured. FIG. 1 is a plot of these absorbance characteristics of the two layers and the dye, individually. The dye alone curve was obtained by dissolving the dye in chloroform, measuring its absorbance and subtract the chloroform absorbance to get the dye only absorbance. The absorbance characteristics of the two layers were indistinguishable except at wavelengths between about 300 and 400 nm. As shown in FIG. 1, the plain polyester had low absorbance in this frequency range, while the dye containing layer had an absorption peak in the vicinity of 350 nm where the dye's own absorption peak is located.

To test the laser ablation characteristics of these layers, an IC chip was mounted on a substrate in the manner taught in the above-referenced patents and a Kapton ® layer was bonded thereover using the polyester adhesive at a lamination temperature of 150° C. A laser at 351 nm was then used to drill holes in the Kapton ® polyimide and polyester layers to expose underlying aluminum contact pads.

In successive tests on the plain polyester layer, it was found that a laser power of 2.75 watts with two scan passes was required to remove the layer completely. In contrast, the dye containing layer was completely removed by two passes at 1.4 watts. In each case, after laser drilling, the parts were plasma etched to remove any carbonaceous residues at the bottoms of the via holes. The parts were then immersed in an aluminum etchant. The polymer layer was considered to have been completely removed by the laser ablative drilling only if all of the aluminum at the bottom of the via hole was removed by the etchant.

This test clearly establishes both the relationship between the dye's absorption spectrum and the absorption spectrum of the dye containing polyester and the increased ability of that layer to be laser ablated at 351 nm.

EXAMPLE 2

Figure 2:
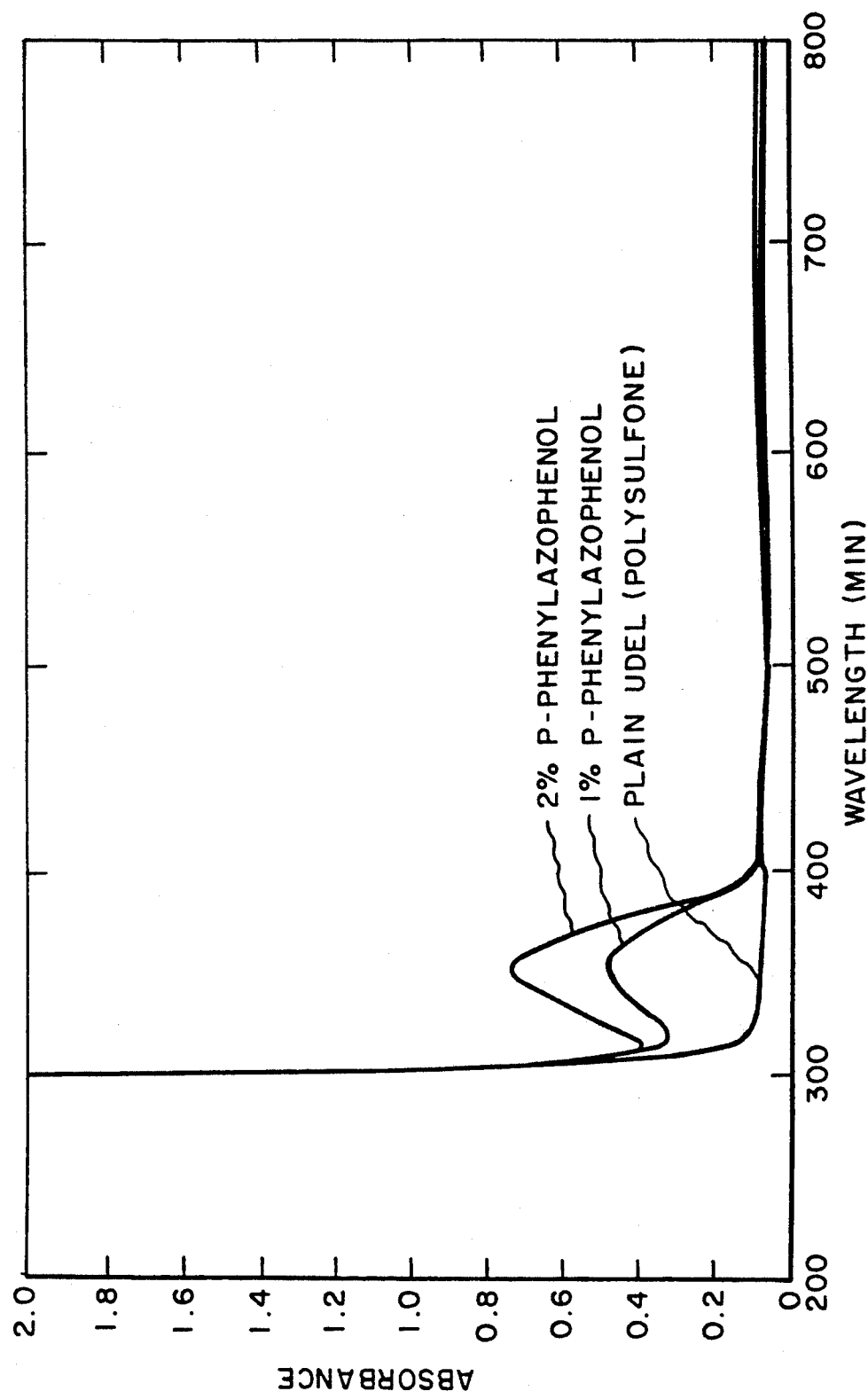
FIG. 2 illustrates a polysulfone polymer absorption spectrum with and without a dye included in the polymer.

Separately, a polysulfone polymer available under the name Udel from Union Carbide Corporation was used to prepare polymer layers having p-phenylazophenol dye concentrations of 0%, 1% and 2% by weight of the polymer. These compositions were formed by dissolving the dye in a solution of the polysulfone in o-dichlorobenzene. Films were formed from these source solutions on quartz in the manner of Example 1 and their absorption spectrum measured. These absorption spectra appear in FIG. 2. As can be seen in FIG. 2, the dye greatly enhances the absorbance of the Udel at 351 nm. To test laser drilling, thin layers of these compositions were spray coated on aluminum and baked to remove the solvent. The resulting layers were each about 4 microns thick. Laser drilling was then done using two scan passes for each hole. Following this drilling, the samples were plasma etched and inspected by optical microscopy. The sample containing 2% dye was cleanly laser etched at all power levels from 1.0 watt to 2.2 watts (powers less than 1 not having been tried). The sample containing 1% dye was not as clean as the sample containing 2% dye. The sample without dye had residual material present at all power levels from 1.0 to 2.2 watts. Thus, the ability of the addition of dye to substantially reduce the power level required to laser ablate this polymer material is clearly shown by this example.

EXAMPLE 3

Figure 3:
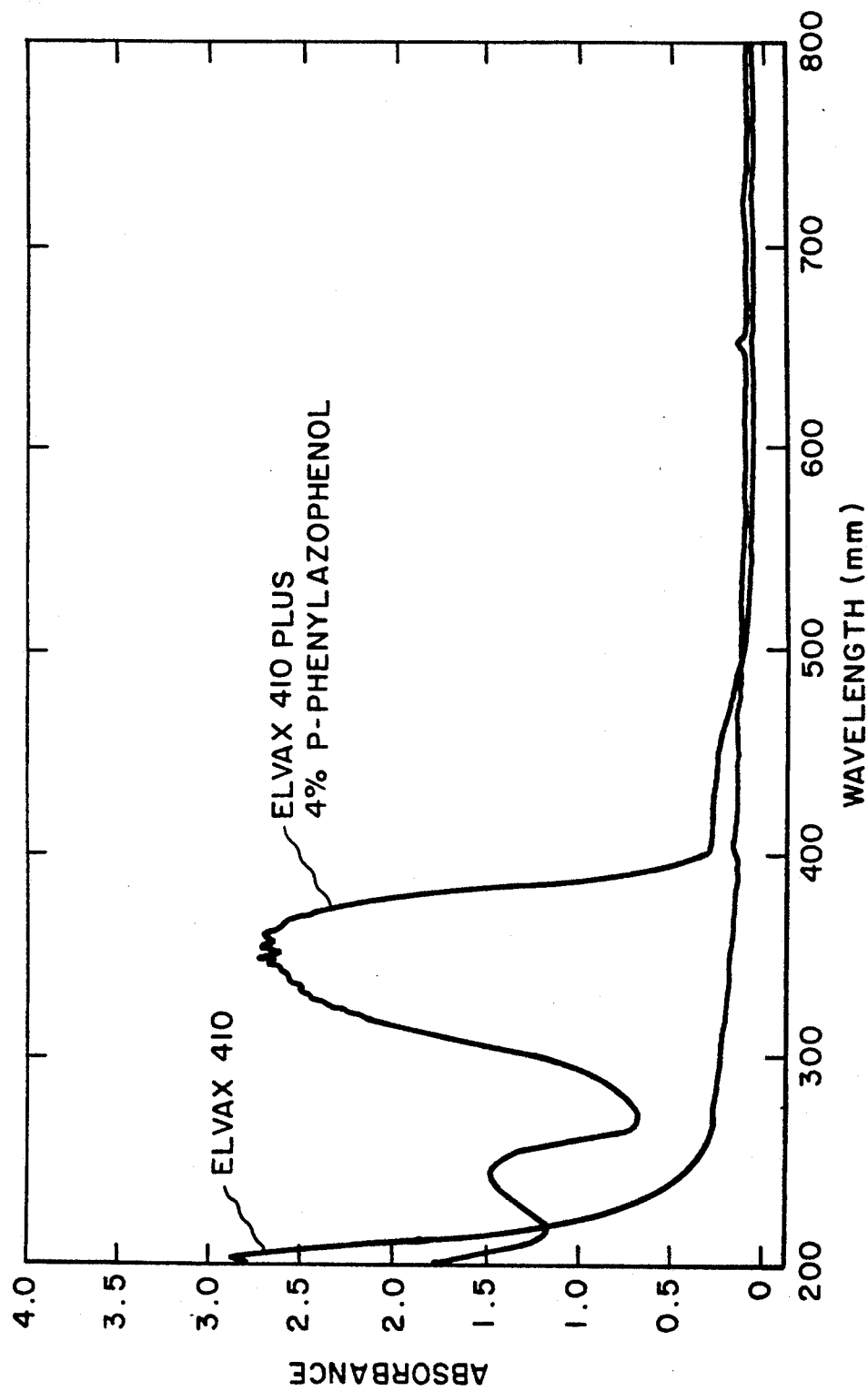
FIGS. 3-5 illustrate absorption spectra of various polymer materials.

Elvax 410 is a copolymer of ethylene and vinylacetate commercially available for E. I. DuPont de Nemours which has applications as a hot melt adhesive. This material softens well below 100° C. and is supplied in pellet form. A formulation was prepared to render this material laser ablatable. 0.4 gram of p-phenylazophenol was mixed at about 120° C. with 1 gram of Elvax 410 in the absence of solvents. At this temperature, the copolymer viscosity was low enough to allow uniform mixing and dissolution of the dye. After a few minutes of mixing, the uniform dye/copolymer blend (dyed copolymer) was cooled to room temperature. The dyed copolymer solidified during this cooling. A small amount of this dyed copolymer was melted between two quartz plates and the absorbance spectra measured. The absorbance of a similar sample without dye was also measured. Both spectra are shown in FIG. 3. As shown, the addition of dye greatly enhances the absorbance at 351 nm. Films of Kapton were then laminated to separate glass substrates using either the plain copolymer or the dyed copolymer. The films were then laser drilled at various power and scan levels.

At between 1.5 and 2.5 W laser power, the Kapton was laser drilled, but the underlying Elvax layer was unaffected upon microscopic examination. Thus, the plain ethylene vinylacetate copolymer could not be laser drilled. However, the copolymer sample with 4% dye added was completely laser drilled at power levels as low as 1.5 W and 2 scans per hole.

EXAMPLE 4

The following formulations were prepared:

1. 1 gram polymethylmethacrylate (PMMA)
    3 grams toluene
2. 1 gram polymethylmethacrylate
    3 grams toluene
    0.06 gram N-p-methoxybenzylidene-p-phenylazoaniline
3. 1 gram polymethylmethacrylate
    3 grams toluene
    0.06 gram 2,6-dihydroxyanthraquinone The extinction coefficient of the azo dye in formulation 2 is larger than the extinction coefficient of the anthroquinone dye in formulation 3.

The above solutions were spin coated on separate quartz substrates and baked for one hour at 100° C. to remove the solvent. The absorbance spectra were measured and again showed the dramatic increase in absorbance produced by the addition of dyes to the non-absorbing polymer. These spectra are shown in FIG. 4.

The above samples were laser drilled at various laser power levels and number of scans per hole. The plain PMMA (sample #1) could not be laser drilled at power levels up to 2.5 W and 4 scan passes. Sample #2 was laser drilled at power levels as low as 1.2 W with 2 scan passes and sample #3 was laser drilled at power levels as low as 1.8 W and 2 scan passes. These results are consistent with the relative absorbances of these three samples at 351 nm.

Figure 4:
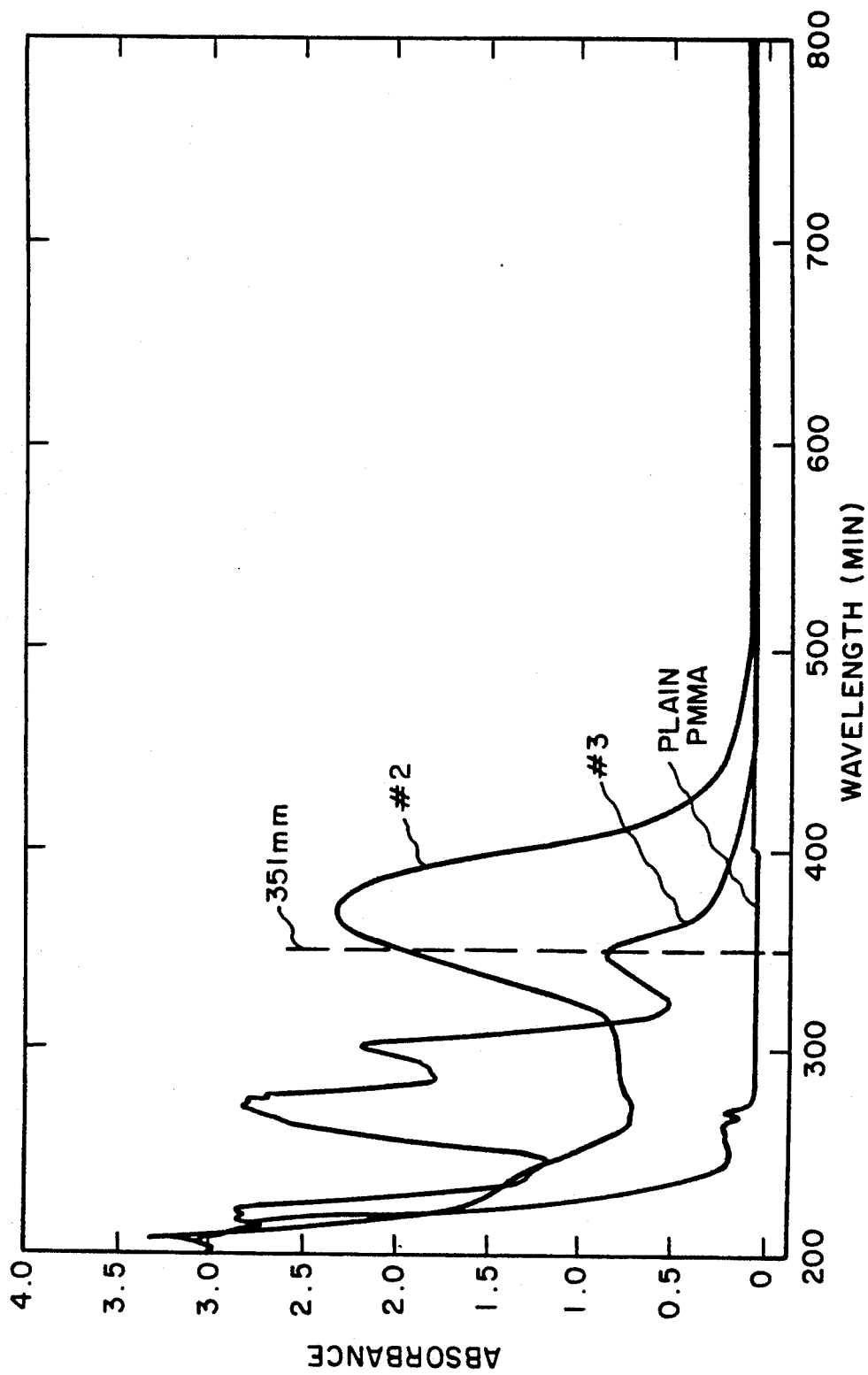

The efficiency of the dye additive is directly related to the extinction coefficient and the concentration of dye additive used as is shown by the absorbance of formulation #2 being higher at 351 nm than the absorbance of formulation #3 as shown in FIG. 4.

EXAMPLE 5

Figure 5:
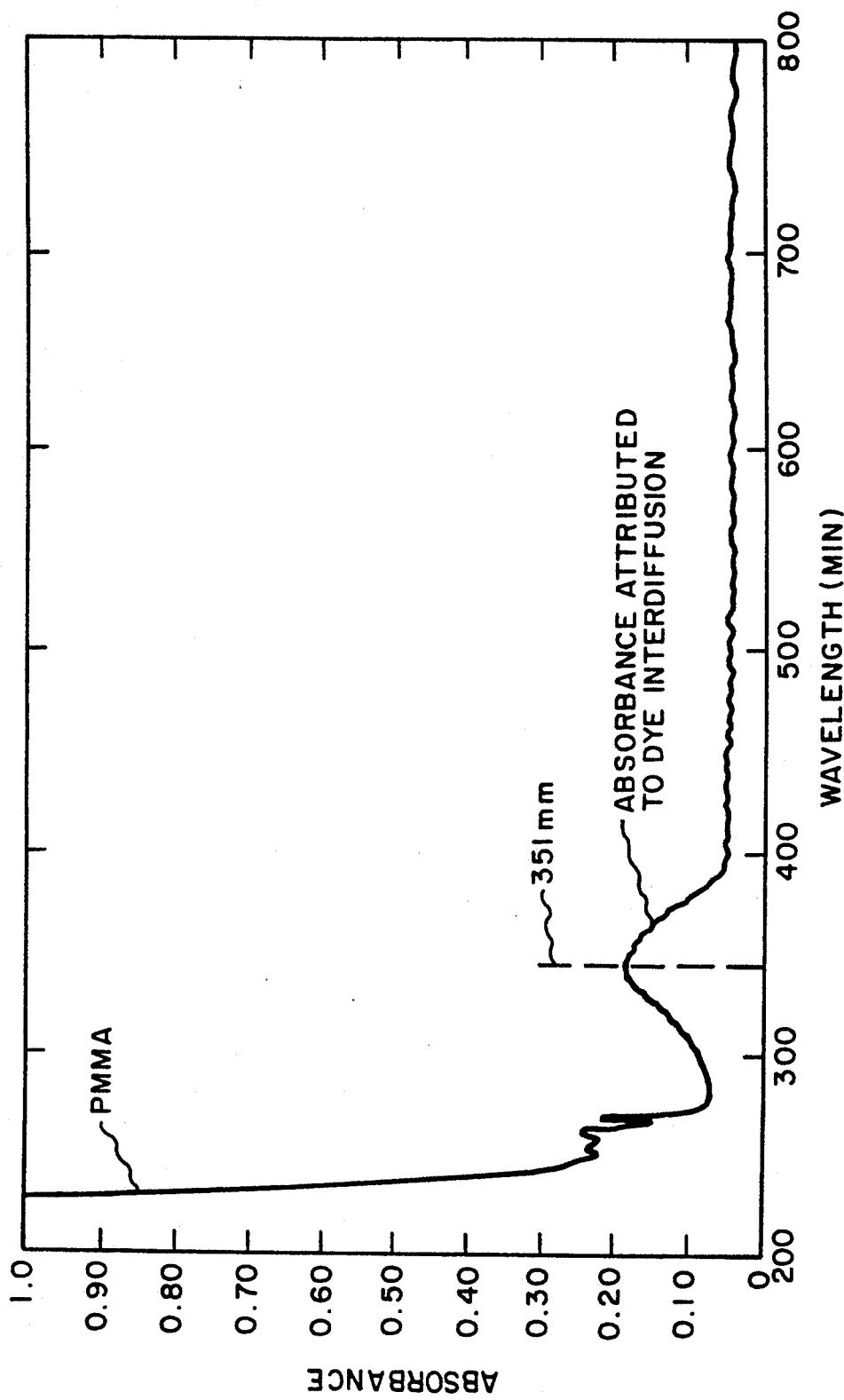

The plain film of PMMA (sample #1) from Example 4 was dipped in a saturated solution of p-phenylazophenol in toluene, removed and air dried prior to oven baking at 100° C. to remove residual solvent. An absorbance spectra was measured and is shown in FIG. 5. The peak at 351 nm is attributed to the p-phenylazophenol which interdiffused into the polymer structure with solvent molecules during the immersion in the dye solution. This result demonstrates the feasibility of dye interdiffusion as a means of improving the absorbance characteristics of a polymeric film and hence, improving the film's laser drilling characteristics. The dye concentration in the polymer and its depth of penetration into the polymer naturally depends on the dye concentration in the solvent and the length of time allowed for the desired interdiffusion to occur. Beneficial dye concentrations may vary from as little as about 0.1% or 1.0% to as much as 10% or more by weight of the source or plain polymer. However, a dye concentration of at least 0.5% is generally needed to significantly increase the laser ablatability of the polymer. While there is in concept no strict upper limit on dye concentration, it is preferred to keep the dye concentration below 10% to minimize effects on the polymer's other properties. Generally, a dye concentration in the range from 0.5% to 5% is preferred.

In contrast to these examples, commercially available teflon films which are rendered opaque and colored by the addition of particles, are not laser ablatable at 351 nm even though they are non-transmissive at that frequency. This non-ablation characteristic is believed to be a result of the relatively large size of the particles which prevents them from effectively transferring any absorbed energy to the host polymer material in order to ablate it. The variety of polymers and dyes in the above examples make it clear that this invention has wide applicability and is not unique to any particular polymer or dye and, so long as the conditions of small dye size and wide distribution are met, ablatability will be enhanced, independent of the particular polymer and particular dye used and thus is of wide utility.

An amorphous fluoropolymer family is now commercially available from DuPont De Nemours, Inc. which has desirable characteristics for high density interconnect structures. Two of these products are sold under the trade names teflon AF 1600 and AF 2400. These polymers are amorphous teflon and are soluble in certain perfluorinated solvents. These polymers by themselves have high optical clarity down to 200 nm, however, by addition of the dyes disclosed herein, the polymer can be made laser ablatable at 351 nm. These amorphous fluoropolymers can be readily coated from solution to form dielectric layers for HDI and other structures. The addition of dyes to render these materials laser ablatable makes them fully compatible with the HDI process.

In accordance with the dye characteristics enumerated above, any of a wide variety of dyes other than p-phenylazophenol, N-p-methoxybenzylidene-p-phenylazoaniline and dihydroxyanthraquinone may be used, either as already formulated, or with substitutions to adjust their absorbance frequencies or newly synthesized dyes may be used.

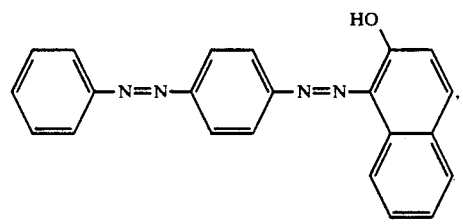

whose maximum absorbance is at 354 nm; Sudan IV, structural formula

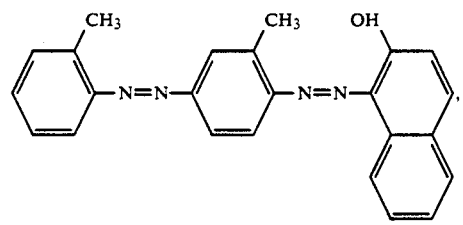

whose maximum absorbance is at 357 nm; Sudan Orange G, structural formula

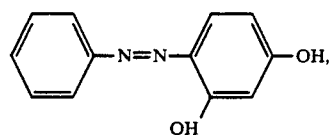

whose maximum absorbance is at 388 nm; Sudan Red 7B, structural formula

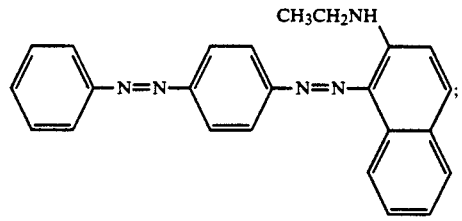

beta carotene; other anthraquinone dyes; and so on. Other polymers and adhesives such as polystyrene, maleic anhydride copolymers, other polyesters, polycarbonates, vinyl ether copolymers, vinyl acetate polymers and copolymers, polyethersulfones and others may be used.

Figure 6:
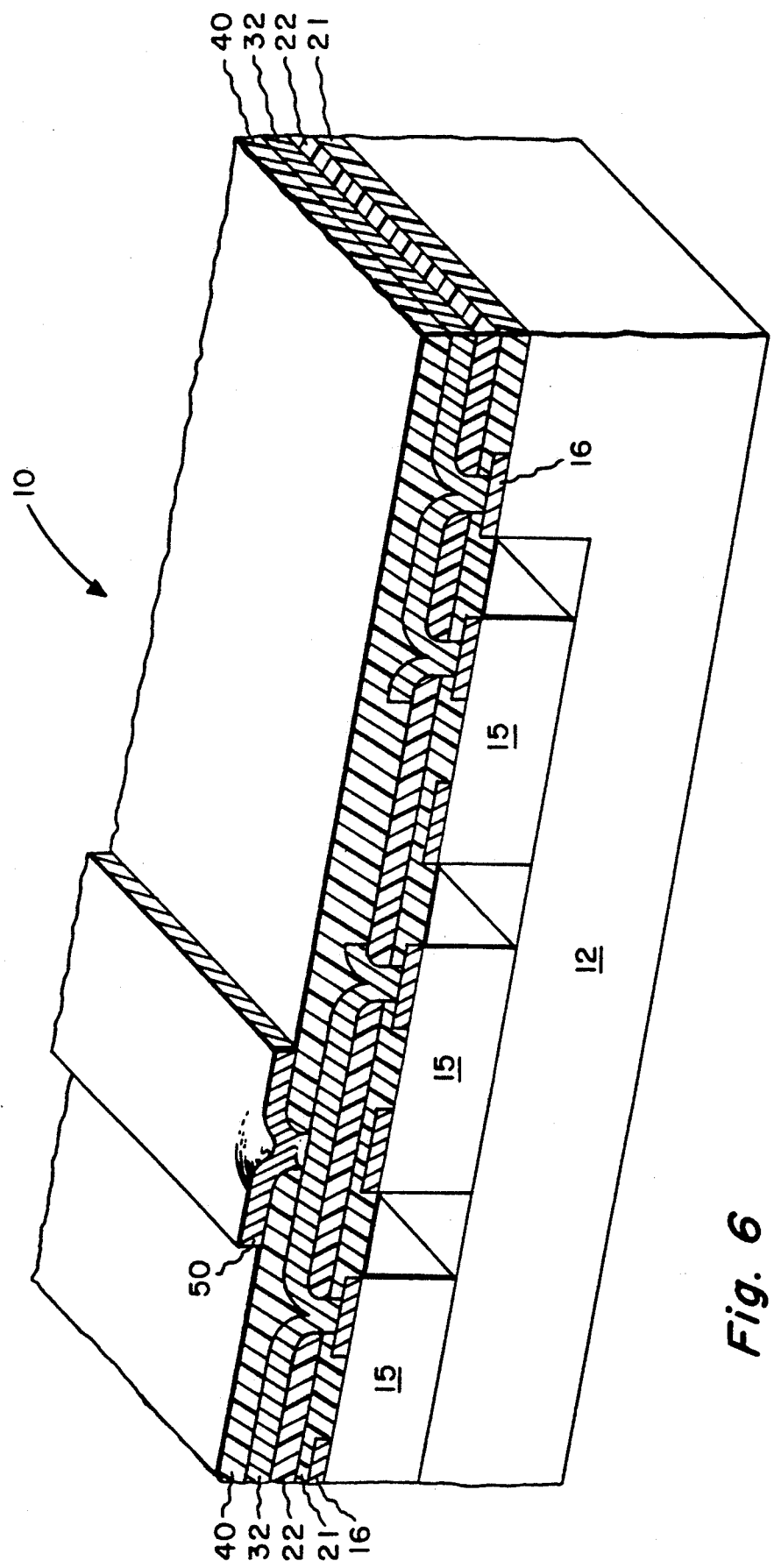
FIG. 6 illustrates a high density interconnect structure incorporating a modified polymer layer in accordance with the invention.

A high density interconnect structure 10 incorporating a dielectric layer in accordance with the present invention is illustrated in cross-section in FIG. 6 where a substrate 12 has integrated circuit chips 15 disposed in cavities therein. The integrated circuits 15 have contact pads 16 disposed on the upper surfaces thereof. A Kapton ® polyimide layer 22 is bonded to the top of the integrated circuit and the substrate by an adhesive layer 21 of p-phenylazophenol-dye-containing polyester. Via holes are laser drilled in the dielectric layers 22/21 and an overlying metal layer 30 is disposed on the top of the dielectric layer and in the via holes and patterned to produce individual conductors 32. An additional dielectric layer 40 is disposed over the conductive layer 30 and has via holes 42 disposed therein into which a second metal layer 50 extends to make contact to the first metal layer 30.

In this structure, the adhesive layer 21 is a polyester having a melting point in the vicinity of 150° C. which is generally considered to be too low a temperature for use in a final product high density interconnect structure in a high temperature environment. However, this structure is ideal for intermediate testing prior to assembly of the final structure since the low melting point of the adhesive 21 facilitates the non-destructive disassembly of the structure at the end of testing as taught in U.S. Pat. No. 4,884,122 entitled "Method and Configuration for Testing Electronic Circuits and Integrated Circuit Chips Using a Removable Overlay Layer" (application Ser. No. 230,654 filed Aug. 5, 1988). Many other dyes and other polymers may be used in this high density interconnect structure in accordance with this invention.

While it is preferred that the dye be soluble in the polymer with the result that individual molecules of the dye are spaced from each other and substantially evenly distributed in the polymer layer, this invention can also be successful where the dye is not soluble in the polymer provided it can be distributed substantially uniformly through the polymer as minute particles smaller than about 1 micron in size. Such small particles act very much like individual molecules in transferring their absorbed energy to the host polymer material in order to affect its ablation.

While the above examples have been directed to the formation of the layer beginning with a basic polymer, it will be recognized that the dye material may be mixed with the basic polymer at the time of its manufacture with the result that the polymer pellets or powder or the solvent source solution of the polymer, as the case may be, will already incorporate a dye in accordance with this invention. This has the advantage of saving the user from the labor and expense of mixing a selected dye with the host polymer in order to provide the desired layer or film.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method of making a high density interconnect structure, comprising:

providing a module substrate having a plurality of integrated circuit chips disposed in at least one cavity in the module substrate, the integrated circuit chips having contact pads on upper surfaces thereof;

providing a dye-containing polymer dielectric layer which is laser ablatable at a selected ultraviolet wavelength at which said polymer is substantially transparent by:

(a) combining said polymer and a dye selected from the group consisting of p-phenylazophenol, N-p-methoxybenzylidene-p-phenylazoaniline, dihydroxyanthraquinone,

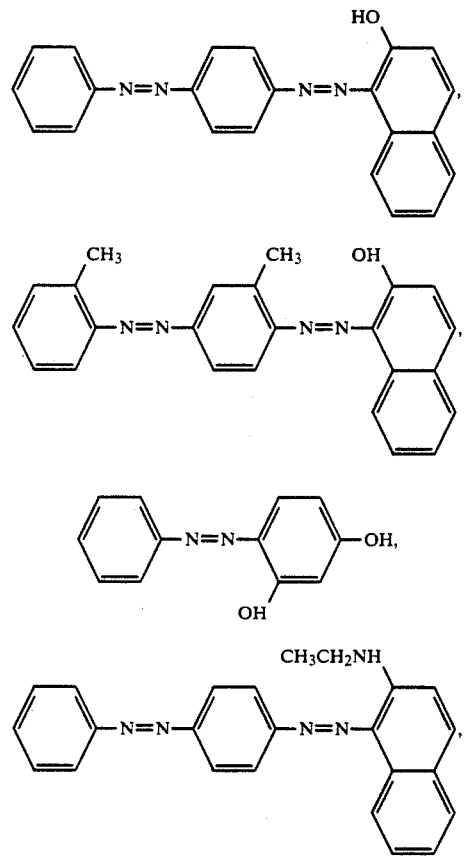

and beta carotene having an absorption band which includes said selected ultraviolet wavelength with a sufficient quantity of solvent in which said polymer and said dye are mutually soluble to form a solvent solution of said polymer and said dye, said dye being present in sufficient concentration to render the layer to be formed in substep (c) laser ablatable at said selected ultraviolet wavelength, (b) coating a layer-forming substrate with said solvent solution, and (c) removing said solvent to leave a layer of said polymer with said dye distributed in said polymer in a laser ablation enabling manner;

applying said dye-containing polymer dielectric layer over said integrated circuit chips and said module substrate;

employing a laser at the selected wavelength to drill via holes in said dye-containing polymer dielectric layer; and forming a patterned metal layer over at least said dye-containing polymer dielectric layer extending into said via holes in contact with said chip contact pads.

2. The method recited in claim 1 wherein:
said dye is substantially uniformly distributed in said polymer.

3. The method recited in claim 1 wherein:
said dye is in solution in said polymer of said layer.

4. The method recited in claim 1 wherein:
said dye is dispersed in said polymer layer as a suspension of particles less than 1 μm in size.

5. The method recited i claim 1 wherein:
said selected ultraviolet wavelength is 351 nm.

6. The method recited in claim 1 wherein:
said polymer melts at a temperature of less than 200° C.; and
said dye is thermally stable over a range of temperatures above the melting point of said polymer.

7. A method of making a high density interconnect structure, comprising:
providing a module substrate having a plurality of integrated circuit chips disposed in at least one cavity in the module substrate, the integrated circuit chips having contact pads on upper surfaces thereof;
providing a dye-containing polymer dielectric layer which is laser ablatable at a selected ultraviolet wavelength at which said polymer is substantially transparent by:
(a) melting said polymer to form a melt,
(b) adding a dye selected from the group consisting of p-phenylazophenol, N-p-methoxybenzylidene-p-phenylazoaniline, dihydroxyanthraquinone,

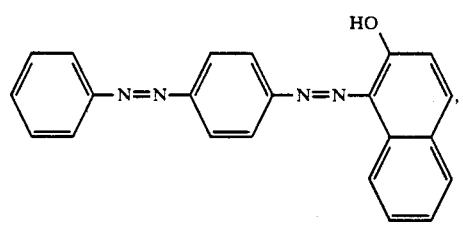

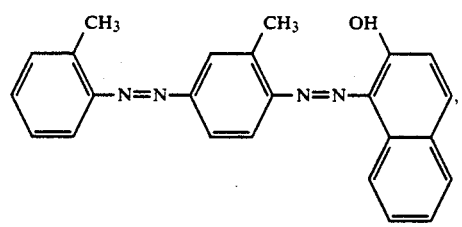

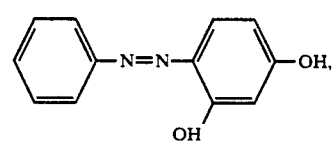

-continued

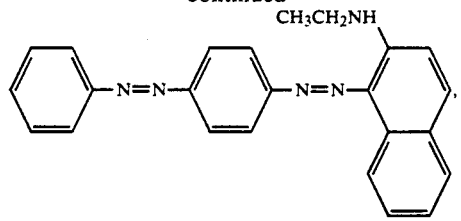

and beta carotene having an absorption band which includes said selected ultraviolet wavelength to said melt and distributing said dye substantially uniformly within said polymer melt, said dye being added in sufficient quantity to render the layer to be formed in substep (d) laser ablatable at said selected wavelength, (c) coating a layer-forming substrate with said dye-containing polymer melt, and (d) allowing said melt to solidify to form said layer with said dye distributed in said polymer of said layer in a laser oblation enabling manner, said dye being thermally stable during said adding, coating and allowing substeps;

applying said dye-containing polymer dielectric layer over said integrated circuit chip and aid module substrate;

employing a laser at the selected wavelength to drill via holes in aid dye-containing polymer dielectric layer; and forming a patterned metal layer over at least said dye-containing polymer dielectric layer extending into said via holes in contact with said chip contact pads.

8. The method recited in claim 7 wherein:
said dye is substantially uniformly distributed in said polymer layer.

9. The method recited in claim 7 wherein:
said dye is in solution in said polymer of said layer.

10. The method recited in claim 7 wherein:
said dye is disposed in said polymer of said layer as a suspension of particles less than 1 μm in size.

11. The method recited in claim 7 wherein:
351 nm is within both said polymer pass band and said dye absorption band.

12. The method recited in claim 7 further comprising the steps of:
agitating said melt after adding said dye to distribute said dye in said polymer melt.

13. A method of providing a dye-containing polymer layer which is laser ablatable at a selected ultraviolet wavelength at which said polymer is substantially transparent, comprising the steps of:
dissolving a dye selected from the group consisting of p-phenylazophenol, N-p-methoxybenzylidene-p-phenylazoaniline, dihydroxyanthraquinone,

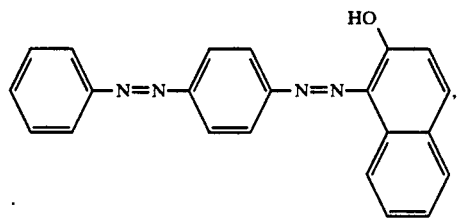

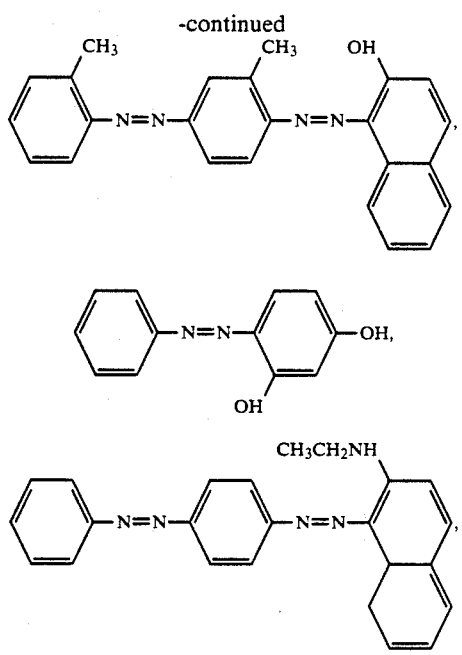

and beta carotene having an absorption band which includes said selected ultraviolet wavelength in a solvent in which said polymer and said dye are both soluble; and coating a layer of said polymer with the solvent solution of said dye; and removing said solvent after said dye has dissolved into said polymer layer to render at least a portion of said polymer layer laser ablatable.

14. The method recited in claim 13 wherein:
said dye is substantially uniformly distributed in said laser ablatable portion of said polymer layer.

15. The method recited in claim 13 wherein:
said dye is in solution in said polymer.

16. The method recited in claim 13 wherein:
said dye is dispersed in said polymer as a suspension of particles less than 1 μm in size.

17. The method recited in claim 13 wherein:
said selected ultraviolet wavelength is 351 nm.

18. The method recited in claim 13 wherein:
said polymer melts at a temperature of less than 200° C.; and
said dye is thermally stable over a range of temperatures above the melting point of said polymer.

19. A method of making a high density interconnect structure, comprising:
providing a module substrate having a plurality of integrated circuit chips disposed in at least one cavity in the module substrate, the integrated circuit chips having contact pads on upper surfaces thereof;
providing a dye-containing polymer dielectric layer which is laser ablatable at a selected ultraviolet wavelength at which said polymer is substantially transparent and which comprises an adhesive layer which melts at less than 200° C. by:

(a) combining said polymer and a dye having an absorption band which includes said selected ultraviolet wavelength with a sufficient quantity of solvent in which said polymer and said dye are mutually soluble to form a solvent solution of said polymer and said dye, said dye being present in sufficient concentration to render the layer to be formed in substep (c) laser ablatable at said selected ultraviolet wavelength, (b) coating a layer-forming substrate with said solvent solution, and (c) removing said solvent to leave a layer of said polymer with said dye distributed in said polymer in a laser ablation enabling manner;

employing said dye-containing polymer dielectric layer as an adhesive layer to bond a polyimide dielectric layer to said integrated circuit chips and said substrate;

employing a laser at the selected wavelength to drill via holes in aid polyimide dielectric layer and in said dye-containing polymer dielectric layer; and forming a patterned metal layer over said polyimide dielectric layer extending into said via holes in contact with said chip contact pads.

20. A method of making a high density interconnect structure, comprising:
providing a module substrate having a plurality of integrated circuit chips disposed in at least one cavity in the module substrate, the integrated circuit chips having contact pads on upper surfaces thereof;
providing a dye-containing polymer dielectric layer which is laser oblatable at a selected ultraviolet wavelength at which said polymer is substantially transparent and which comprises an adhesive layer which melts at less than 200° C. by:

(a) melting said polymer to form a melt.

(b) adding a dye having an absorption band which includes said selected ultraviolet wavelength to said melt and distributing said dye substantially uniformly within said polymer melt, said dye being added in sufficient quantity to render the layer to be formed in substep (d) laser ablatable at said selected wavelength, (c) coating a layer-forming substrate with said dye-containing polymer melt, and (d) allowing said melt to solidify to form said layer with said dye distributed in said polymer of said layer in a laser ablation enabling manner, said dye being thermally stable during said adding, coating and allowing substeps;

employing said dye-containing polymer dielectric layer as an adhesive layer to bond a polyimide dielectric layer to said integrated circuit chips and said substrate;

employing a laser at the selected wavelength to drill via holes in said polyimide dielectric layer and in said dye-containing polymer dielectric layer; and forming a patterned metal layer over said polyimide dielectric layer extending into said via holes in contact with said chip contact pads.

* * * * *